United States Patent
Lai et al.

(10) Patent No.: US 7,757,144 B2
(45) Date of Patent: Jul. 13, 2010

(54) SYSTEM AND METHOD FOR TESTING INTEGRATED CIRCUIT MODULES COMPRISING A PLURALITY OF INTEGRATED CIRCUIT DEVICES

(75) Inventors: Bosco Chun Sang Lai, Markham (CA); Sunny Lai-Ming Chang, Markham (CA); Charlie Song, Markham (CA); Kevin Chu, Scarborough (CA)

(73) Assignee: KingTiger Technology (Canada) Inc., Markham, Ontario (CA)

( * ) Notice: Subject to any disclaimer, the term of this patent is extended or adjusted under 35 U.S.C. 154(b) by 337 days.

(21) Appl. No.: 11/933,796

(22) Filed: Nov. 1, 2007

(65) Prior Publication Data

US 2009/0115443 A1    May 7, 2009

(51) Int. Cl.
*G01R 31/28* (2006.01)
(52) U.S. Cl. ...................................... 714/744
(58) Field of Classification Search ................. 714/731, 714/744
See application file for complete search history.

(56) References Cited

U.S. PATENT DOCUMENTS

| | | | |
|---|---|---|---|
| 4,379,259 A | 4/1983 | Varadi et al. ................... 714/45 |
| 4,484,329 A | 11/1984 | Slamka et al. ................ 714/734 |
| 4,821,238 A | 4/1989 | Tatematsu .................... 365/201 |
| 4,965,799 A | 10/1990 | Green et al. ................. 714/719 |
| 5,794,175 A | 8/1998 | Conner ........................ 702/119 |
| 5,959,914 A | 9/1999 | Gates et al. .................. 365/201 |
| 5,995,424 A | 11/1999 | Lawrence et al. ............ 365/201 |
| 6,014,759 A | 1/2000 | Manning ....................... 714/42 |
| 6,055,653 A | 4/2000 | LeBlanc et al. .............. 714/718 |
| 6,055,661 A | 4/2000 | Luk ............................ 714/736 |
| 6,058,055 A | 5/2000 | Brunelle ...................... 365/201 |
| 6,134,690 A | 10/2000 | Ivaturi et al. ................ 714/736 |
| 6,178,526 B1 | 1/2001 | Nguyen et al. ................ 714/42 |
| 6,275,962 B1 | 8/2001 | Fuller et al. .................. 714/724 |
| 6,345,372 B1 | 2/2002 | Dieckmann et al. ......... 714/720 |
| 6,389,525 B1 | 5/2002 | Reichert et al. ............. 711/217 |
| 6,425,095 B1 | 7/2002 | Yasui .......................... 714/42 |
| 6,452,411 B1 | 9/2002 | Miller et al. ................. 324/765 |
| 6,546,511 B1 | 4/2003 | Sim et al. .................... 714/724 |
| 6,574,759 B1 | 6/2003 | Woo et al. ................... 714/718 |
| 6,615,379 B1 | 9/2003 | Tripp et al. .................. 714/736 |
| 6,646,936 B2 | 11/2003 | Hamamatsu et al. ........ 365/201 |
| 6,701,474 B2 | 3/2004 | Cooke et al. ................ 714/724 |
| 6,708,298 B2 * | 3/2004 | Corbin et al. ............... 714/702 |
| 6,731,125 B2 | 5/2004 | Chang ......................... 324/765 |
| 6,754,117 B2 | 6/2004 | Jeddeloh ..................... 365/201 |
| 6,851,076 B1 | 2/2005 | Cook, III et al. ............ 714/718 |

(Continued)

OTHER PUBLICATIONS

Co-pending U.S. Appl. No. 11/779,629, filed Jul. 18, 2007 Lai, et al.

*Primary Examiner*—James C Kerveros
(74) *Attorney, Agent, or Firm*—Bereskin & Parr LLP/S.E.N.C.R.L., s.r.l.

(57) ABSTRACT

A system and method for testing an integrated circuit module including multiple integrated circuit devices that provide a data strobe signal associated with at least one data signal provided by the same integrated circuit device. A determination of a test outcome for the integrated circuit module may be made after identifying data valid windows for each integrated circuit device, without having to both identify a common sampling window defined by an intersection of the identified data valid windows and verify that such common sampling window meets specification requirements.

17 Claims, 8 Drawing Sheets

U.S. PATENT DOCUMENTS

| | | | |
|---|---|---|---|
| 6,880,118 B2 * | 4/2005 | Chen et al. | 714/727 |
| 6,888,366 B2 | 5/2005 | Kim et al. | 324/765 |
| 7,010,452 B2 * | 3/2006 | Gomes et al. | 702/117 |
| 7,085,980 B2 | 8/2006 | Martin-de-Nicolas et al. | 714/736 |
| 7,088,122 B2 | 8/2006 | Hartmann et al. | 324/765 |
| 7,092,902 B2 | 8/2006 | Eldridge et al. | 705/26 |
| 7,119,567 B2 | 10/2006 | Ma et al. | 324/763 |
| 7,131,046 B2 | 10/2006 | Volkerink et al. | 714/732 |
| 7,142,003 B2 | 11/2006 | Kanbayashi et al. | 324/765 |
| 7,159,160 B2 * | 1/2007 | Yoh et al. | 714/724 |
| 7,216,273 B2 * | 5/2007 | Phelps et al. | 714/724 |

* cited by examiner

SYSTEM AND METHOD FOR TESTING INTEGRATED CIRCUIT MODULES COMPRISING A PLURALITY OF INTEGRATED CIRCUIT DEVICES

TECHNICAL FIELD

The described embodiments relate to a system and method for testing integrated circuit modules, such as memory modules. More particularly, the described embodiments relate to the testing of multiple integrated circuit devices, such as memory devices, that are assembled into a single integrated circuit module.

BACKGROUND

Integrated circuit devices are typically subject to rigorous testing before they are sold or put to their intended use. In particular, each integrated circuit device is tested to determine whether or not certain specifications for that type of device, as determined and set by the manufacturer, are met.

Complete testing of an integrated circuit device comprises both functional testing as well as application-specific testing. Functional testing relates to whether or not the hardware found within the integrated circuit device is free from defects and meets manufacturers' specifications. For example, if the integrated circuit device is or comprises a memory component such as a memory module or a memory device, functional testing relates to whether or not a digital value written to a cell of memory will later be retrieved without error, regardless of how the memory module or memory device is implemented.

Functional testing also relates to whether or not certain critical operating characteristics of the integrated circuit device fall within the allowable range of values. These critical operating characteristics include such characteristics as power consumption, standby current, leakage current, voltage levels, and access time. The allowable range may equally be set by the manufacturer of the device or by the corresponding appropriate standards.

Functional testing is generally oriented toward discovering whether or not an integrated circuit device under test is likely to fail during its intended use or application. It involves testing integrated circuit devices to verify how they execute a set of functions during testing procedures that are specifically designed for this purpose.

Complete testing of an integrated circuit device also involves application-specific testing. During application-specific testing, integrated circuit devices may be subject to a testing of their system behavior in order to detect their behavioral failures. Behavioral failure is a type of failure that occurs when an integrated circuit device is operated within an actual application system. For example, it may be a failure that occurs as a result of a specific command or access sequence to a memory device or memory module found in normal PC operations.

It is not necessarily the case that functional testing will detect behavioral failures because, during that type of testing, the operation of the integrated circuit device under test is not necessarily indicative of how the device will behave during its intended application. Accordingly, complete and comprehensive testing of an integrated circuit device may require application-specific testing in addition to functional testing.

The testing of integrated circuit devices may involve the use of test vector patterns. In particular, test vector patterns may be generated by an appropriate test vector generator and then transmitted by a tester to a device under test across a communication channel. The device under test then sends a response signal to the tester. The response signal may be compared to a copy of the transmitted test vector pattern that is stored by the tester to determine if the device under test has produced an expected result.

SUMMARY

Embodiments disclosed herein relate generally to a system and method for testing an integrated circuit module (e.g. memory modules) that comprises a plurality of integrated circuit devices (e.g. memory devices).

In one broad aspect, there is provided a method of testing an integrated circuit module, the integrated circuit module comprising a plurality of integrated circuit devices, the method comprising: generating a plurality of test vector patterns; generating a first clock signal having a first frequency and a first phase; generating a plurality of second clock signals, each of the plurality of second clock signals having the first frequency and one of a plurality of second phases; for each of the plurality of test vector patterns and for each of the plurality of second clock signals: transmitting the respective test vector pattern and the first clock signal to at least one of the plurality of integrated circuit devices via a communication channel, receiving at least one data signal from the at least one of the plurality of integrated circuit devices via the communication channel in response to said act of transmitting, capturing the at least one data signal received from the at least one of the plurality of integrated circuit devices in digital form by sampling the at least one data signal using the respective second clock signal of the plurality of second clock signals, comparing the at least one data signal when captured in digital form with a reference pattern associated with the respective test vector pattern, and determining one or more results from said act of comparing, wherein the one or more results are associated with both the respective test vector pattern and the respective second clock signal having one of the plurality of second phases; identifying a data valid window for each of the plurality of integrated circuit devices from at least one of said results determined for the plurality of test vector patterns and the plurality of second clock signals; verifying that the data valid window for each of the plurality of integrated circuit devices meets specification requirements; determining at least one test outcome for the integrated circuit module, wherein the at least one test outcome is based on at least one result of said act of verifying; and at least one of recording and outputting the at least one test outcome for the integrated circuit module; wherein each of the plurality of integrated circuit devices, when in operation, utilizes a data strobe signal that accompanies at least one of data signals being transmitted from and data signals received by the respective integrated circuit device; and wherein the act of determining at least one test outcome is performed after the act of identifying a data valid window for each integrated circuit device of the integrated circuit module without having both computed a common sampling window and verified that the common sampling window meets specification requirements.

Features of this and other aspects, and of a number of example embodiments are described herein.

BRIEF DESCRIPTION OF THE DRAWINGS

For a better understanding of embodiments of the systems and methods described herein, and to show more clearly how they may be carried into effect, reference will be made, by way of example, to the accompanying drawings in which.

DETAILED DESCRIPTION

Figure 1:
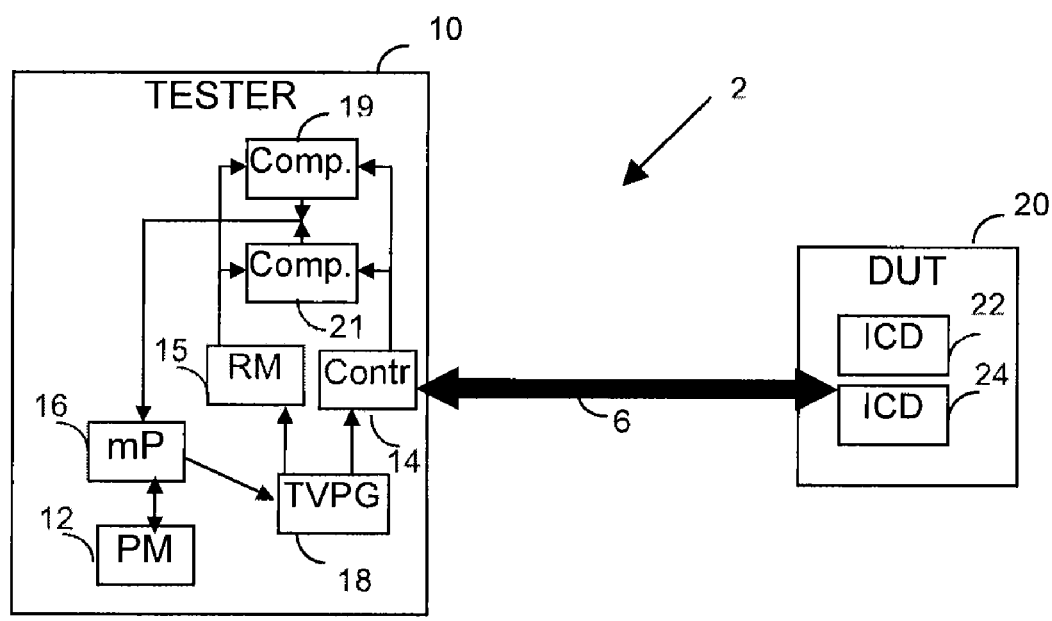
FIG. 1 is a block diagram of a testing system comprising an integrated circuit module under test and a tester module in accordance with at least one embodiment.

Reference is now made to FIG. 1, in which a test system 2 for testing integrated circuit modules (e.g. a memory module) comprising multiple integrated circuit devices (e.g. memory devices) is illustrated. A tester 10 is coupled to the device under test (DUT) 20 across a communication channel 6. DUT 20 is an integrated circuit module comprising at least two integrated circuit devices. In the example shown in FIG. 1, the device under test 20 is an integrated circuit module comprising a first integrated circuit device (ICD) 22 and a second integrated circuit device 24.

When in use outside of a testing environment, DUT 20 may operate as part of computer system that comprises a motherboard containing a chipset [not shown], which may comprise a controller (e.g. a memory controller), for example. However, for testing purposes, DUT 20 may be tested independently of other components of the computer system and placed on a testing board, where tester 10 interfaces with DUT 20 in order to check the functionality of DUT 20 using test vector patterns generated by tester 10. Alternatively, or in addition to functional testing, DUT 20 may operate within a system where "normal" programs indicative of what would be executed under typical system operations are executed, and tester 10 interfaces with DUT 20 by "tapping" the inputs and outputs of DUT 20 to determine whether DUT 20 is operating properly under these operating conditions (i.e. DUT 20 is generating the expected outputs given the inputs being provided to DUT 20).

Some of the components of tester 10 are illustrated by way of example in FIG. 1 and described below. It will be understood by persons skilled in the art that in variant embodiments, tester 10 may comprise different components than those shown in FIG. 1. Furthermore, it will be understood that tester 10 may comprise components that are not explicitly described with reference to FIG. 1 for ease of exposition.

In one embodiment, tester 10 comprises a microprocessor (mP) 16, program memory (PM) 12, a test vector pattern generator (TVPG) 18, a controller 14, and at least one comparator for each integrated circuit device of DUT 20. In the example shown in FIG. 1, tester 10 comprises a first comparator 19 and a second comparator 21, one for each of two integrated circuit devices of DUT 20. Comparator 19 may correspond with one of ICD 22 and ICD 24, while comparator 21 may correspond with the other of ICD 22 and ICD 24, for example.

Where DUT 20 is a memory module, and where ICD 22 and ICD 24 are memory devices, the tester 10 may also comprise a reference memory module (RM) 15. If ICD 22 and ICD 24 are ASICs, the tester 10 may comprise a reference logic module [not shown]. Some electrical connections between the various components of tester 10 are illustrated, by way of example, in FIG. 1. Some basic operations of tester 10 are described in the paragraphs below.

In performing the testing of DUT 20, microprocessor 16 retrieves an instruction or instructions from program memory 12. In response to that instruction, microprocessor 16 instructs TVPG 18 to generate a digital representation of a test vector pattern, which TVPG 18 then sends to controller 14. Controller 14 communicates with DUT 20 via a communication channel 6. After receiving the test vector pattern generated by TVPG 18, controller 14 converts the test vector pattern into an electrical waveform, which controller 14 then outputs to DUT 20 via communication channel 6. TVPG 18 also sends a digital representation of the test vector pattern to either reference memory module 15 or a reference logic module [not shown], as the case may be depending on the nature of the device being tested, for temporary storage and use at a later stage in the testing.

The test vector pattern output by controller 14 is transmitted electrically across communication channel 6 to DUT 20, where it is sampled back into digital form. At some point after the test vector pattern has been transmitted to DUT 20, DUT 20 electrically transmits across the communication channel a response signal for each integrated circuit device of DUT 20, namely ICD 22 and ICD 24 in this example. The response signals transmitted back to tester 10 for each of ICD 22 and ICD 24 are generally transmitted in parallel. Controller 14 of tester 10 then converts the response signals received via communication channel 6 into digital form. Regardless of whether the integrated circuit devices of DUT 20 are memory devices or ASICs, controller 14 will expect to receive and then sample a particular waveform as a response from each of the integrated circuit devices, the characteristics of which will depend on the nature of each particular integrated circuit device and on the test vector pattern that was previously transmitted to it by tester 10.

Tester 10 and DUT 20 both operate on digital representations of test vector patterns. However, as noted above, what is transmitted across communication channel 6 is an electrical waveform that is representative of the test vector waveform. Conversion between the electrical and digital forms of a test vector pattern generally occurs at the input and/or output ports of both tester 10 and DUT 20. In the case of tester 10, in this example embodiment, it is controller 14 that performs the conversion. In the case of DUT 20, an appropriate component or module thereon [not shown] may be configured to perform the conversion.

After controller 14 receives response signals from each of ICD 22 and ICD 24 of DUT 20 via communication channel 6 and converts the response signals to digital form, it relays the converted response signals from ICD 22 and ICD 24 to comparators 19 and 21 respectively. At each comparator (19, 21), the response signal from the corresponding ICD (22, 24) is compared with a digital form of a reference signal (i.e. a reference bit pattern, also generally referred to as an expected bit pattern), namely the signal that controller 14 expects to receive from the particular integrated circuit device (22, 24) that sent the response signal. In one embodiment, the previously stored reference signals are transmitted to comparators 19 and 21 by either reference memory module 15 or a reference logic module [not shown], as the case may be depending on the nature of the integrated circuit devices of DUT 20 being tested. Comparators 19 and 21 digitally determine whether or not the response signals identically match the reference signals, and output that logical determination to microprocessor 16.

For any given comparator (19, 21), if the comparator determines an identical match between the two compared signals (i.e. a response signal and a reference signal), then the corresponding integrated circuit device (22, 24) being tested has, at least in the context of that particular test vector pattern, produced valid data. But where the two signals compared are not identical, then the integrated circuit device (22, 24) may have undergone failure of some kind. Where all of the integrated circuit devices of a DUT 20 that comprise an integrated circuit module have been determined to perform according to specification requirements, then DUT 20 may be considered to be a "good" integrated circuit module.

If DUT 20 is a memory module comprised of multiple memory devices, then the reference signal is simply the digital representation of the test vector pattern as generated by TVPG 18. The process of writing to and reading from a memory cell does not, in general, involve digital logic. Therefore, there is no expectation of data transformation as part of the testing process. This fact is reflected in the functionality of reference memory module 15. The digital test vector pattern sent to comparators 19 and 21 from reference memory module 15 is delayed until controller 14 samples the returning waveforms, the purpose of the delay being to align timing. Reference memory module 15 transmits the reference signal to each of comparators 19 and 21, for comparison with the signals received from the memory devices of DUT 20 and transmitted to the respective comparator by the controller 14.

On the other hand, if DUT 20 is an integrated circuit module comprising multiple ASICs, then for each ASIC being tested, the reference signal sent to the corresponding comparator is the logical output of the particular ASIC being tested, given the test vector pattern generated by TVPG 18 as input. The operation of an ASIC does in general involve some form of digital logic. Therefore, there is an expectation of data transformation as part of the testing process. This fact is reflected in the functionality of the reference logic module. The digital reference signals sent to each of comparators 19 and 21 from the reference logic module is the vector test pattern after it has been transformed according to the expected functionality of the corresponding ASIC module being tested, and is delayed until controller 14 samples the returning waveforms. In other words, the reference logic module simulates the functionality of each ASIC by transforming a particular input into the expected output, and delays sending a corresponding reference signal to the respective comparator (19, 21) for the purpose of time aligning. The reference logic module transmits reference signals to each of comparators 19 and 21, for comparison with the signals received from the ASICs of DUT 20 and transmitted to the respective comparator by the controller 14.

The device under test can be any integrated circuit module that comprises multiple devices other than memory devices and/or ASICs, in variant embodiments.

As previously noted, the test vector patterns and the response signals transmitted electrically across communication channel 6 have to be converted back into digital signals at DUT 20 or tester 10 respectively. When DUT 20 receives a test signal from tester 10, then DUT 20 performs the conversion by sampling the received signal. Similarly, when tester 10 receives a response signal from DUT 20, then controller 14 of tester 10 may perform the conversion by sampling the received signal.

Where the device under test is an integrated circuit module that comprises multiple integrated circuit devices, each of the integrated circuit devices may produce signals that are transmitted to the tester in response to test signals received from the tester. In order for the tester to determine if the response from each integrated circuit device is as expected, the tester will need to sample the data signals received in response from each of the integrated circuit devices.

One technique that conventional testers might employ in order to sample multiple data signals utilizes a single sampling clock signal generated at the tester. Data may be sent to an integrated circuit device (e.g. a memory device) and captured from the memory device in accordance with a timing that is synchronized with the sampling clock signal. Where the data signals originating from multiple integrated circuit devices within an integrated circuit module are to be captured for example, the data signals generated by each of the integrated circuit devices may be sampled simultaneously, synchronized with the sampling clock signal (e.g. at each of the clock's rising edges). This technique may be referred to as a synchronous capturing of multiple data signals, and is discussed in further detail with reference to the following example.

Consider an example test methodology where test signals are to be transmitted from a tester (e.g. tester 10 of FIG. 1) to a device under test (e.g. DUT 20 of FIG. 1) comprising multiple integrated circuit devices. A set of pre-determined test vector patterns that is to be used to test the device under test is initially determined, prior to testing. During the test, a test vector pattern is generated from the set of pre-determined test vector patterns, as noted above. A data signal comprising a test vector waveform corresponding to the generated test vector pattern is transmitted to the device under test, along with an accompanying first clock signal generated by the tester that is synchronized with the test vector waveform. The first clock signal is synchronized with the test vector waveform in accordance with the specification of the device under test, so that the device under test can use the first clock signal to properly read from the test vector waveform. For example, if the device under test is a memory module that comprises multiple memory devices, each memory device that receives a "write" command from the tester will expect that the data intended to be written to memory will follow in the test vector waveform in a certain number of cycles of the first clock signal after the "write" command is received. Subsequently, after data is written to each memory device, data may then be read from the respective memory device by the tester. The data read from the respective memory device is received by the tester, and once the data is converted from an electrical signal to digital form, the data can then be compared with a previously stored reference (e.g. expected) bit pattern.

In this example test methodology, the data received from the integrated circuit devices of an integrated circuit module (e.g. memory devices of a memory module) in response to the previously transmitted test vector patterns are in the form of electrical signals that are sampled at the tester using a second clock signal (i.e. as a "sampling clock signal" referred to above) in order to convert the electrical signals into digital form. The second clock signal may have the same frequency as the first clock signal to which the transmitted test vector waveforms are synchronized. However, unlike the first clock signal that will generally be fixed in phase for a particular test cycle, the second clock signal will generally have an adjustable phase for the same test cycle in this test methodology. In a given test cycle, the phase of the second clock signal may be (e.g. incrementally) adjusted by multiple phase steps (e.g. if the clock frequency is 500 MHz or the period of the second clock signal is 2 ns, then each phase step might be 10 ps). This allows a series of "data valid windows" to be determined for each of the integrated circuit devices being tested within the test cycle, as explained in greater detail below.

Conventional testers for testing integrated circuit modules that comprise multiple integrated circuit devices may implement a synchronous sampling technique when capturing data signals (e.g. response signals) from the integrated circuit devices being tested, wherein a sampling of all of the data signals received from the different integrated circuit devices of DUT 20 being tested may be performed at the same point in time relative to a single (e.g. second) clock signal.

Figure 2:
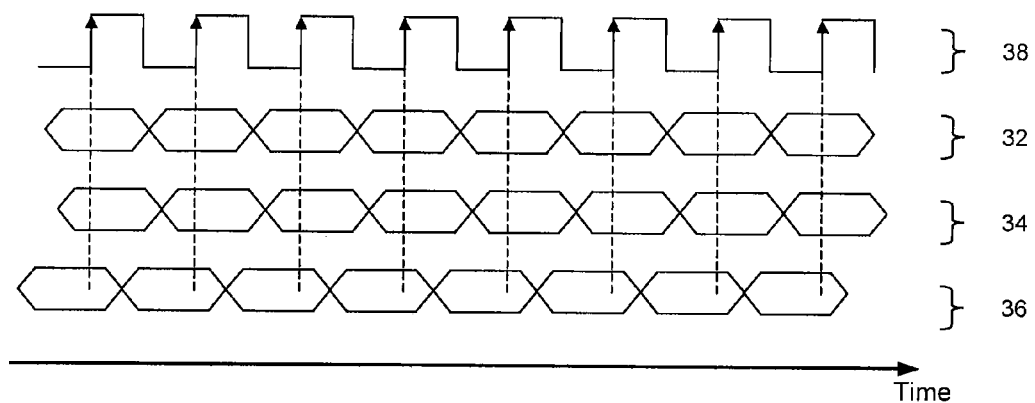
FIG. 2 is an example of a timing diagram that illustrates a technique for sampling multiple data signals using a single clock signal.

Reference is now made to FIG. 2, wherein an example of a timing diagram that illustrates a technique for sampling multiple data signals using a single clock signal is provided. In this example, multiple data signals 32, 34, and 36 are sampled.

In this example, each of the data signals 32, 34, and 36 is received by a tester from a different component of the device under test. For example, each data signal may originate from one of three memory devices in a memory module being tested, in response to test vector signals previously transmitted to the memory module by the tester. It will be understood that the data signals 32, 34, and 36 received by the tester will not generally be perfectly aligned, which may be caused by a number of factors. For example, the different distances between the tester and the individual memory devices within the memory module may introduce slight phase differences between the data signals that are ultimately received from the various memory devices by the tester in response to the test vector signals previously transmitted to the memory module.

The sampling of the signals received by the tester is synchronized with a single clock signal 38, which may be the second clock signal as previously described, operating at one of a series of phase steps in a test cycle. Clock signal 38 may be represented by a square wave where the rising edge triggers a sampling of data signals 32, 34, and 36 at substantially the same instant. It will be understood that in certain test methodologies, a sampling of data signals may alternatively occur at each falling edge of clock signal 38, or at both the rising and falling edges of clock signal 38, for example.

In accordance with one example test methodology, for each data signal 32, 34 and 36, a series of "data valid windows" may be identified. Each data valid window defines a period of time in which a valid sample can be expected to be taken from the given data signal. A sample taken outside of a data valid window may not contain valid data. A data valid window may account for delays associated with memory access, data propagation, clock skew, and variations due to temperature and voltage, for example. Each integrated circuit device of an integrated circuit module may have a different data valid window associated therewith. Each data valid window identified for each integrated circuit device is also expected to meet specification requirements for that type of integrated circuit device.

Figure 3:
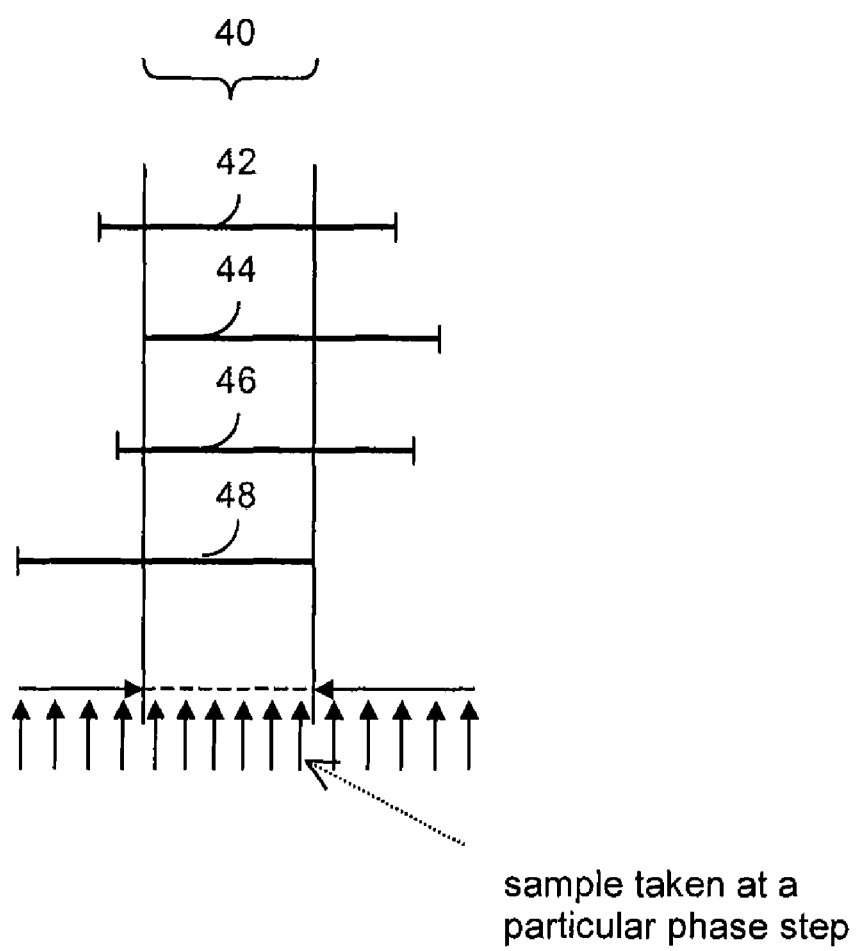
FIG. 3 is a schematic diagram that illustrates how a common sampling window may be defined based on a data valid window that has been identified for each integrated circuit device in an integrated circuit module comprising multiple integrated circuit devices.

It will be understood that data signals 32, 34 and 36 may be out of phase as shown in the example of FIG. 2, and accordingly, the series of data valid windows that might be identified for each of the data signals 32, 34, and 36 may not be perfectly aligned with each other. To illustrate by way of a further example, a set of data valid windows that has been identified for an integrated circuit module comprising four integrated circuit devices is shown in FIG. 3, as data valid windows 42, 44, 46 and 48 respectively.

In order to identify a series of data valid windows for a given integrated circuit device, in accordance with one example test methodology, test vector pattern signals and a corresponding first clock signal (e.g. with a fixed particular phase) are retransmitted to the integrated circuit device of the integrated circuit module under test, while the phase of the second sampling clock is (e.g. incrementally) adjusted by a phase step. This is followed by a sampling of the data signals that are subsequently received from the integrated circuit device in response to the transmitted test vector pattern signals. The samples of the data signals obtained for the particular phase can be compared to an expected bit pattern. The samples may be stored and/or the results of the subsequent comparisons may be stored. The retransmission of test vector pattern signals to the integrated circuit device, the phase changing of the second sampling clock, the sampling of data signals received from the integrated circuit device, and the storage and comparison of the samples obtained may be repeated for each phase step of a pre-defined number of phase steps that comprise a test cycle, as illustrated by the series of arrows in FIG. 3. It will be understood that as the second sampling clock is changed in phase, the samples obtained from a particular data signal will be valid at certain phases (i.e. a stable value is obtained from the data signal and it matches the expected value), while the samples obtained from the data signal at other phases will not be valid (i.e. the signal value obtained at the given phase step does not always match the expected value). Where the integrated circuit device being tested is "good", it will be expected that a valid sample of the particular data signal received from a corresponding integrated circuit device may be taken over a finite number of consecutive phase steps of the second sampling clock, provided that the phase steps are sufficiently small. Using this information, a test engineer or test program, for example, will be able to identify a corresponding length of time in which a valid sample can be expected to be taken from the particular data signal originating from the integrated circuit device. This length of time may be defined for that particularly integrated circuit device conceptually as a "data valid window" for that integrated circuit device.

Referring to the example of FIG. 2, an application of the example test methodology where phase changing of the second clock signal is implemented might be depicted by a shifting of a second clock signal 38 (e.g. shifted to the left or to the right in FIG. 2) in pre-defined increments or decrements of time, followed by a sampling of data signals 32, 34 and 36. Data signals 32, 34 and 36 will not generally be subject to shifting despite the second clock signal 38 being shifted as data signals 32, 34 and 36 will generally be synchronized with the first clock signal, which has a fixed phase for a given test cycle. Accordingly, as clock signal 38 is shifted at each phase step in a given test cycle, and a sample of each data signal 32, 34 and 36 is taken (e.g. at the rising edge of clock signal 38), it will be understood that the rising edge of clock signal 38 at certain phase steps will not align with a part of at least one of the data signals 32, 34 and 36 from which a valid sample may be taken. It will be understood that for any given data signal 32, 34 and 36, a valid sample may only be expected when the rising edge (in this example) is aligned with a part of the respective data signal where the respective data signal will not be undergoing a transition from one signal level to another. The period of time in which the respective data signal is expected to be stable can be identified using the example test methodology described above, and represents the data valid window for the integrated circuit device from which the respective data signal is received.

Figure 4A:
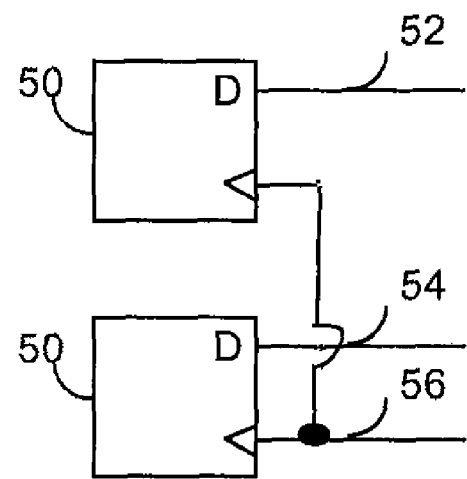
FIG. 4A schematically illustrates a number of components in an example system for synchronously capturing multiple data signals.

As noted above, a synchronous sampling technique may be applied in the testing of certain integrated circuit modules comprising multiple integrated circuit devices. Many conventional testing methodologies utilize this technique. Reliance on this technique may have originated from the fact that the operation of capturing data from at least some older integrated circuit modules typically made use of a "global" clock signal, wherein the capturing of data from all multiple integrated circuit devices within the same integrated circuit module utilized the same global clock to time various operations (e.g. read). FIG. 4A, for example, schematically illustrates a number of components in an example system for synchronously capturing multiple data signals. A register 50 for each input 52, 54 allows data signals received at inputs 52, 54 to be captured, the sampling of the inputs being synchronized to a global clock signal received at 56. Only two registers and inputs are shown in this example, although it will be understood that variant systems adapted to synchronously capture multiple data signals may comprise additional registers and inputs.

Given that a global clock signal may have been used to time operations for capturing data from an integrated circuit module, a given integrated circuit device operating within the integrated circuit module may have generally been considered as operating jointly with the other integrated circuit devices in the integrated circuit module. This may have led to the defining of certain operating parameters for the integrated circuit module as a whole to be restricted to the common portion of operating parameters of the constituent integrated circuit devices. For example, the testing of integrated circuit modules may comprise verifying that various parameters, such as the properties of data valid windows identified for constituent integrated circuit devices, meet specification requirements. Verification that other operating parameters meet specification requirements may also be performed by a tester, depending on the configuration of the tester.

Referring again to the example test methodology described above, test engineers employing conventional testing methodologies may not have deemed it sufficient to ensure that the data valid window identified for each integrated circuit device meets specification requirements for that type of integrated circuit device. Where the device under test is an integrated circuit module comprising multiple integrated circuit devices, it may have been considered necessary to ensure that a similar window common to all of the integrated circuit devices in the integrated circuit module could be defined, and that the window could be determined to meet specification requirements for the integrated circuit module. In particular, given that the capturing of data from and/or by many older integrated circuit modules may time operations (e.g. reading from or writing to constituent integrated circuit devices) using a global clock, it may be expected that in operation, attempts will be made to sample the data signals of all of the integrated circuit devices of an integrated circuit module at the same points in time. Therefore, it may appear necessary to ensure that the data valid windows identified for all integrated circuit devices in a particular integrated circuit module overlap for a certain period of time. This may ensure that valid data may be captured from each integrated circuit device, by sampling the data signals of each integrated circuit device during the period in which the data valid windows overlap.

Accordingly, in one example test methodology used to test integrated circuit modules comprising multiple integrated circuit devices, at least one common sampling window for the integrated circuit module under test is identified. A common sampling window may be defined by the intersection of multiple data valid windows, where each data valid window has been identified for an integrated circuit device of the integrated circuit module under test.

For example, FIG. 3 is a schematic diagram that illustrates how a common sampling window may be identified based on a data valid window identified for each integrated circuit device, in an integrated circuit module comprising multiple integrated circuit devices. In this example, a common sampling window 40 is identified for an integrated circuit module comprising four integrated circuit devices.

Each of the four integrated circuit devices generates a data signal for which an associated data valid window (42, 44, 46 and 48 respectively) may be identified. The common sampling window 40 defines a period of time in which the data valid windows 42, 44, 46 and 48 overlap. Common sampling window 40 can be computed or otherwise determined as a logical intersection of all of the identified data valid windows 42, 44, 46 and 48. It will be understood that instances of the common sampling window 40 and data valid windows 42, 44, 46 and 48 may repeat at a certain interval, depending on the nature of the underlying signals.

In this example test methodology, after determining a common sampling window 40 from the intersection of individual data valid windows 42, 44, 46 and 48, verification may be made to ensure that the length of the common sampling window 40 meets specification requirements for the integrated circuit module. Put another way, if the period of time during which all of the data valid windows of the integrated circuit devices in an integrated circuit module under test overlap does not meet the specification requirements for the integrated circuit module (e.g. the period of time in which the data valid windows overlap is too short, or there is no period of time in which the data valid windows overlap), the integrated circuit module may be considered to have failed the testing procedure, and may be flagged as defective and subsequently discarded.

From the above description of the example test methodology, it will be understood that even if each of the individual data valid windows identified for the various integrated circuit devices of the integrated circuit module under test is such that the properties of a given data valid window would have satisfied specification requirements had the associated integrated circuit device been tested on its own (e.g. each individual data valid window would have been considered sufficiently wide), it may nevertheless be the case that the individual data valid windows do not overlap in such a way to define a common sampling window that also satisfies specification requirements for the integrated circuit module. Accordingly, the integrated circuit module as a whole may be rejected as not meeting specification requirements under the example testing methodology.

The present inventors observed that certain newer types of integrated circuit modules are designed in a manner that does not rely on a global clock to time operations for the capturing of data from and/or by each of its constituent integrated circuit devices. Instead, certain newer types of integrated circuit modules provide and/or receive an individual clock-like signal associated with each integrated circuit device, which may be used to time operations for the capturing of data (e.g. read, write) with respect to that specific integrated circuit device.

For example, some memory devices are designed to utilize what may be referred to by persons skilled in the art as a data strobe signal. The data strobe signal may accompany both incoming and outgoing data signals. For a given memory device, this data strobe signal may be considered as a clock-like signal fed to the memory device or received from the memory device. The data strobe signal may be aligned with corresponding incoming or outgoing data signals, in a manner that facilitates the capturing of data signals at the memory device or by another data recipient (e.g. a component of a chipset on a motherboard) respectively. Some examples of memory devices that are designed to utilize such a data strobe signal include, without limitation, double-data rate synchronous dynamic random access memory (DDR SDRAM), double-data rate two synchronous dynamic random access memory (DDR2 SDRAM), and double-data rate three synchronous dynamic random access memory (DDR3 SDRAM).

The data strobe signal utilized by certain integrated circuit devices (e.g. memory devices) may facilitate a source-synchronous capturing of data signals. For example, where an integrated circuit module comprises multiple integrated circuit devices, each of which provides its own clock-like oscillating data strobe signal along with data signals that can be captured (e.g. by a component of a chipset on a motherboard), a recipient of the data signals could sample the data signals originating from each integrated circuit device separately using the clock-like oscillating data strobe signal provided by the respective integrated circuit device.

Figure 4B:
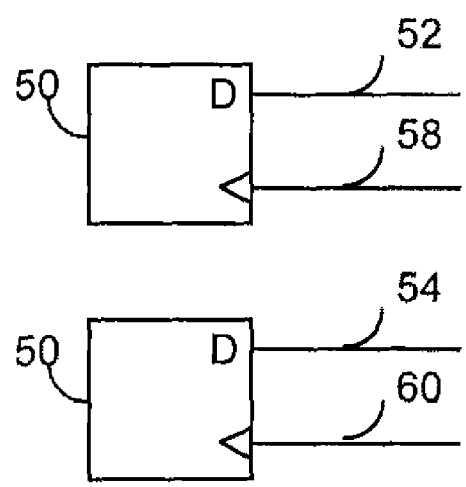
FIG. 4B schematically illustrates a number of components in an example system for source-synchronously capturing multiple data signals.

FIG. 4B schematically illustrates a number of components in an example system for source-synchronously capturing data signals. A register 50 for each input 52, 54 allows data signals received at inputs 52, 54 to be captured. However, in contrast to the system of FIG. 4A, the capturing of data signals in the system of FIG. 4B is not synchronized to a single clock signal. Instead, a data strobe signal that may be used to trigger the sampling of the data signal received at 52 is received at 58. A separate data strobe signal that may be used to trigger the sampling of the data signal received at 54 is received at 60. In the sense that a data strobe signal is used in the sampling of an associated data signal, the data strobe signal may be regarded as a type of sampling clock for use specifically with the associated data signal.

For example, the data signal (which may be a multi-bit signal) received at 52 and a corresponding data strobe signal received at 58 may originate from one integrated circuit device of an integrated circuit module, while the data signal (which may be a multi-bit signal) received at 54 and a corresponding data strobe signal received at 60 may originate from another integrated circuit device of the integrated circuit module. Only two registers and inputs are shown in this example, although it will be understood that variant systems adapted to source-synchronously capture data signals may comprise additional registers and inputs.

Examples of memory devices that provide a data strobe signal that may facilitate a source-synchronous capturing of data signals include, without limitation, DDR SDRAM, DDR2 SDRAM, and DDR3 SDRAM. In respect of such memory devices, the data strobe signal (e.g. DQS) is a clock-like signal that may be transmitted with associated data signals (e.g. DQ) being sent to or captured from the memory devices (i.e. the data strobe signal may be bi-directional) to indicate when those associated data signals are valid. The clock-like service of data strobe signals may be achieved by oscillating the data strobe signal, and time-aligning the data strobe signal with the associated data signals. The manner in which the data strobe signal is aligned with associated data signals may vary depending on whether the data is being sent to or captured from a memory device.

Figure 5A:
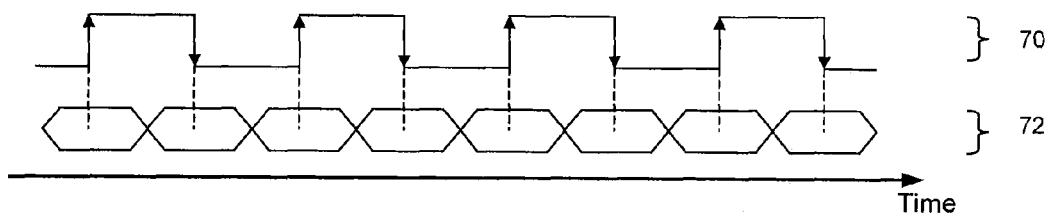
FIGS. 5A and 5B are examples of timing diagrams that illustrate how data strobe signals may be aligned with data signals when data strobe signals and data signals are transmitted to and from a memory device respectively.
Figure 5B:
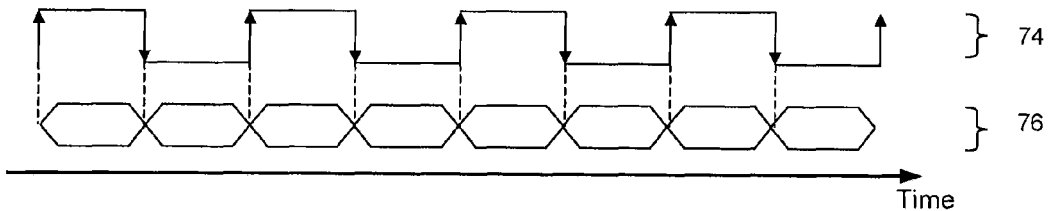

By way of illustration, FIGS. 5A and 5B are examples of timing diagrams that illustrate how data strobe signals may be aligned with data signals when data strobe signals and data signals are transmitted to and from one example of a memory device that provides a data strobe signal respectively. In FIG. 5A, the alignment of a data strobe signal 70 with a data signal 72 being transmitted to a memory device is illustrated. The data strobe signal 70 is represented by a square wave where the rising and falling edges are substantially aligned with the center of each of two consecutive data windows of the data signal 72 from which data may be validly sampled respectively. Accordingly, the data strobe signal being sent to the memory device is center-aligned with a data window. In FIG. 5B, the alignment of a data strobe signal 74 with a data signal 76 transmitted from a memory device is illustrated. The data strobe signal 74 is represented by a square wave where the rising and falling edges are substantially aligned with the beginning of each of two consecutive data windows of the data signal 76 from which data may be validly sampled respectively. Accordingly, the data strobe signal being sent from the memory device is edge-aligned with a data window.

For example, with respect to some memory devices, the data strobe signal is generated and/or received by a memory device for a data signal comprising multiple bits of data (e.g. 8 bits of data) from and/or to that memory device. As noted above, the phase of the data strobe signal relative to the data may depend on the operation being performed (e.g. write or read).

Figure 6A:
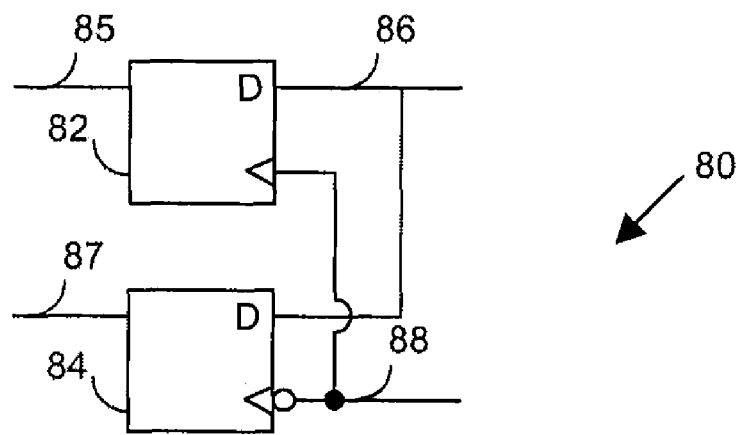
FIGS. 6A and 6B schematically illustrate a number of components in another example system for sending data signals to and capturing data signals from a memory device respectively, in which source-synchronous capturing of data signals is employed.
Figure 6B:
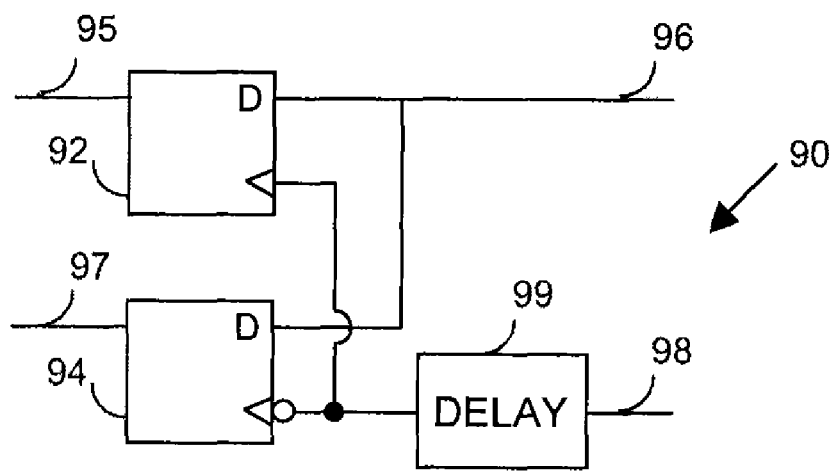

By way of further illustration, FIGS. 6A and 6B schematically illustrate a number of components in example systems for sending data signals to and capturing data signals from one example of a memory device respectively, in which source-synchronous capturing of data signals is employed. In FIG. 6A, components of a system 80 for capturing a data signal 86 being transmitted to the example memory device is illustrated. System 80 comprises a first register 82, a second register 84, a data signal 86 being transmitted to a memory device and a data strobe signal 88. The data signal 86 and the data strobe signal 88 are input to the first register 82, and the data signal 86 and an inverted form of data strobe signal 88 are input to the second register 84. In an example system that employs source-synchronous capturing of data signals, when data is being written to the memory device, the data strobe signal 88 will be center-aligned with the data windows of data signal 86. Accordingly, the first register 82 captures the portion of memory data that have the centers of its data windows from which data may be validly sampled aligned with the rising edges of data strobe signal 88. That portion of memory data is provided at 85. The second register 84 captures the portion of memory data that have the centers of its data windows from which data may be validly sampled aligned with the falling edges of data strobe signal 88. That portion of memory data is provided at 87. In contrast, in FIG. 6B, components of a system 90 for sampling a data signal 96 being transmitted from the example memory device is illustrated. System 90 comprises a first register 92, a second register 94, a data signal 96 transmitted by a memory device, a data strobe signal 98 and a delay module 99. In an example system that employs source-synchronous capturing of data signals, when data is being read from the memory device, the data strobe signal 98 provided by the memory device will be edge-aligned with the data windows of data signal 96. Accordingly, system 90 operates in a manner similar to that of system 80 (FIG. 6A) except that the data strobe signal 98 is delayed by the delay module 99 before it is transmitted to the first and second registers 92 and 94. The delayed data strobe signal is transmitted non-inverted to the first register 92, and in an inverted form to the second register 94. Since the data strobe signal 98 is edge-aligned with the data windows of data signal 96 (see e.g. FIG. 5B), the delay may be used to ensure that a sampling of the data signal 96 occurs substantially at the center of a data window from which data may be validly sampled. In one example implementation, the delay module 99 may affect a phase shift of 90 degrees of the data strobe signal 98 to achieve this. The delay allows the first register 92 to capture the portion of memory data that have the centers of its data windows from which data may be validly sampled aligned with the rising edges of data strobe signal 98. That portion of memory data is provided at 95. The second register 94 captures the portion of memory data that have the centers of its data windows from which data may be validly sampled aligned with the falling edges of data strobe signal 98. That portion of memory data is provided at 97.

Conventional test methodologies exist for testing integrated circuit modules comprising multiple integrated circuit devices. The present inventors have observed that test engineers who implement these known test methodologies may assume, as noted above, that the integrated circuit devices of an integrated circuit module operate jointly within the integrated circuit module. Accordingly, when testing the integrated circuit module, it may be deemed necessary to identify the common portion of certain operating parameters of the constituent integrated circuit devices, and verify that the common portion meets specification requirements. For example, application of some known test methodologies requires that a common sampling window be defined from individual data valid windows identified for the integrated circuit devices in the integrated circuit module under test, and that the properties of the common sampling window meet specification requirements. This may be done without regard to the type of integrated circuit devices of the integrated circuit module being tested.

However, the present inventors realized that the use of such known test methodologies to test integrated circuit devices of an integrated circuit module might not be desirable for all types of integrated circuit devices. For example, an integrated circuit module comprising integrated circuit devices that may not be considered to operate jointly with other integrated circuit devices in the same integrated circuit module need not be rejected for the sole reason that the data valid windows identified for the integrated circuit devices do not overlap, particularly if the data valid window for any given integrated circuit device when considered independently of other integrated circuit devices would be determined to meet specification requirements, and where the integrated circuit module and the integrated circuit devices thereof would otherwise pass all other tests that might be performed by tester.

The present inventors further realized that if an integrated circuit module comprises multiple integrated circuit devices, where each of the integrated circuit devices provides a clock-like oscillating signal that facilitates a source-synchronous capturing of data signals (e.g. at the integrated circuit device and at a recipient of data signals received from the integrated circuit device), then the integrated circuit devices may be considered to operate independently, in the sense that the timing of operations performed at one integrated circuit device with respect to the capturing of data is not synchronized to the timing of operations performed at other integrated circuit devices of the same integrated circuit module, unlike when a global clock is used.

In accordance with at least one embodiment, a method of testing an integrated circuit module comprising a plurality of multiple integrated circuit devices, where each of the plurality of multiple integrated circuit devices provides and/or receives a clock-like signal that facilitates a source-synchronous capturing of data is provided. For example, each multiple integrated circuit device may be a memory device such as, without limitation, DDR SDRAM, DDR2 SDRAM, or DDR3 SDRAM. The clock-like oscillating signal provided by these devices that facilitates a source-synchronous capturing of data may be generally referred to herein, in the description and in the claims, as a data strobe signal. In operation, the data strobe signal provided by a particular integrated circuit device may be used by a device receiving an accompanying data signal (for instance, a data recipient such as e.g., a component in a chipset that receives a data signal transmitted by the integrated circuit device) to determine when the accompanying data signal provided by the device may be validly read. Similarly, the data strobe signal received by a particular integrated circuit device may be provided by a device transmitting an accompanying data signal (for instance, a data transmitter such as e.g., a component in a chipset that transmits a data signal received by the integrated circuit device) to determine when the accompanying data signal provided to the integrated circuit device may be validly captured and written to the integrated circuit device. As noted earlier, data signals may be aligned differently with a corresponding data strobe signal depending on the operation being performed (e.g. an operation to read from or write to the particular integrated circuit device).

Where a plurality of integrated circuit devices are assembled into an integrated circuit module, and wherein each of the plurality of integrated circuit devices is configured to provide a data strobe signal, it may be generally expected that the timing of some of the data strobe signals will be different from others. Since each integrated circuit device of the integrated circuit module provides its own data signals and corresponding data strobe signal, the capturing of data signals transmitted by any given integrated circuit device (e.g. by a chip set on the motherboard) may be timed specifically with reference to the data strobe signal provided by that same integrated circuit device. The present inventors realized that this might allow, for example, the capturing of data signals of one integrated circuit device in an integrated circuit module to be performed independently of the capturing of data signals of another integrated circuit device in the same integrated circuit module. As the capturing of data signals for multiple integrated circuit devices of an integrated circuit module need not be synchronized to a global clock, in operation, the capturing of data signals would not need to be performed within a period of time in which the data valid windows of all of the multiple integrated circuit devices might overlap.

The present inventors further realized that if the integrated circuit devices of an integrated circuit module provided and/or received a data strobe signal that facilitated a source-synchronous capturing of data signals rather than a mechanism that only facilitated a synchronous capturing of data signals, then it would not be necessary to define a common sampling window from intersecting data valid windows identified for the integrated circuit devices. It would also not be necessary to ensure that the common sampling window meets specification requirements, as may be required in known testing methodologies. As a result, an integrated circuit module that comprises this particular type of integrated circuit devices need not be rejected merely because there is no period of time where all of the data valid windows identified for the constituent integrated circuit devices overlap, or because the period of time in which all of the data valid windows overlap does not meet certain specification requirements. Testing of an integrated circuit module comprising integrated circuit devices that facilitate source-synchronous data signal capturing might show that the operation of each integrated circuit device in the integrated circuit module meets specification requirements, without the need to identify a common sampling window or to verify that the common sampling window meets specification requirements. This may result in an increased yield of "good" integrated circuit modules.

Figure 7:
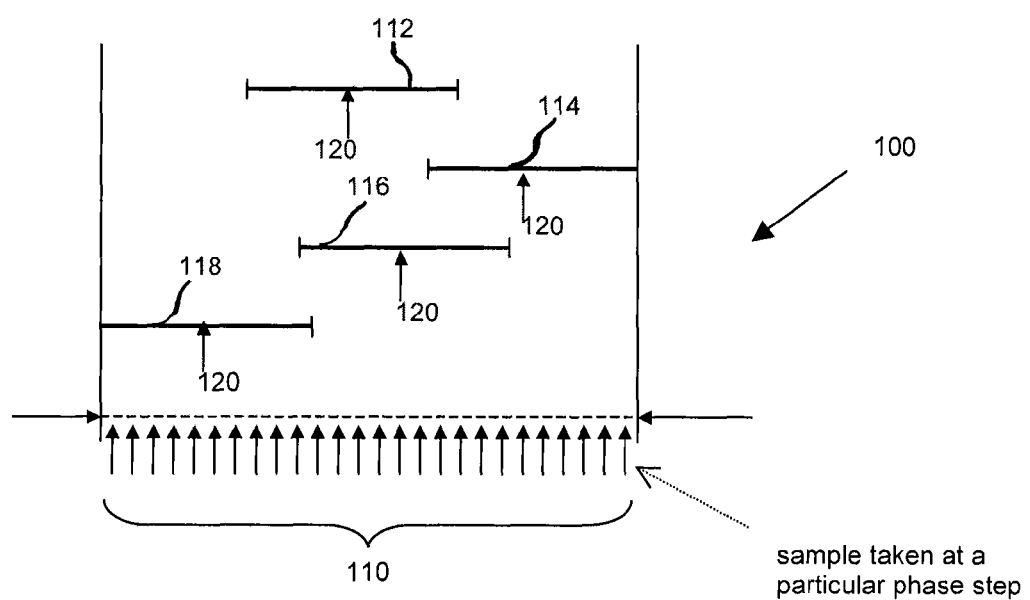
FIG. 7 is a schematic diagram that illustrates a data valid window that has been identified for each integrated circuit device of an integrated circuit module tested in accordance with an example embodiment.

Referring now to FIG. 7, a schematic diagram that illustrates a data valid window that has been identified for each integrated circuit device in an example integrated circuit module tested in accordance with an example embodiment is shown generally as 100.

In one embodiment of a method of testing an integrated circuit module comprising multiple integrated circuit devices, test signals are transmitted from a tester (e.g. tester 10 of FIG. 1) to a device under test (e.g. DUT 20 of FIG. 1) comprising multiple integrated circuit devices. Each integrated circuit device of the integrated circuit module receives a data strobe signal provided by the tester that, in normal operation, would facilitate a source-synchronous capturing of data signals. A set of pre-determined test vector patterns that is to be used to test the device under test is initially determined, prior to testing. A test vector pattern is generated from the set of pre-determined test vector patterns. During a given iteration of a test cycle, a test vector waveform corresponding to the generated test vector pattern, including the data signals and corresponding data strobe signals, is transmitted to the device under test, along with an accompanying first clock signal generated by the tester that is synchronized with the test vector waveform. The first clock signal is synchronized with the test vector waveform in accordance with the specification of the device under test, so that the device under test can use the first clock signal to properly read from the test vector waveform. The device under test may also use the data strobe signal for the capturing of data. For example, if the device under test is a memory module that comprises multiple memory devices, each memory device that receives a "write" command from the tester will expect that the data to be written to memory will follow in the test vector waveform in a certain number of cycles of the first clock signal after the "write" command is received. Subsequently, after data is written to each memory device, data may then be read from the respective memory device. The data read from the respective memory device is received by the tester, and once the data is converted from an electrical signal to digital form, the data can then be compared with a previously stored reference (e.g. expected) bit pattern.

In this embodiment, the data received from the integrated circuit devices of an integrated circuit module (e.g. memory devices of a memory module) in response to the previously transmitted test vector patterns are in the form of electrical signals that are sampled at the tester using a second clock signal as a "sampling clock signal", in order to convert the electrical signals into digital form. The second clock signal may have the same frequency as the first clock signal to which the transmitted test vector waveforms are synchronized. However, unlike the first clock signal that will generally be fixed in phase for a particular test cycle, the second clock signal will generally have an adjustable phase for the same test cycle. In a given test cycle, the phase of the second clock signal may be (e.g. incrementally) adjusted by multiple phase steps (e.g. if the period of the second clock signal is 2 ns, then each phase step may be 10 ps).

A series of data valid windows for the integrated circuit device under test may be identified by repeating the testing procedure described above in respect of an iteration of the test cycle. Test vector pattern signals and a corresponding first clock signal are retransmitted to the integrated circuit device of the integrated circuit module, while the phase of the second sampling clock is (e.g. incrementally) adjusted by a phase step. This is followed by a sampling of the data signals that are received from the integrated circuit device in response to the transmitted test vector pattern signals. The samples of the data signals obtained for the particular phase step may be stored and can be compared to an expected bit pattern. The retransmission of test vector pattern signals to the integrated circuit device, the phase changing of the second sampling clock, the sampling of data signals received from the integrated circuit device, and the storage and comparison of samples of the data signals obtained may be repeated for each phase step of a pre-defined number of phase steps that comprise a test cycle, as illustrated by the arrows 110 of FIG. 7. It will be understood that as the second sampling clock is changed in phase, the samples obtained from a particular data signal will be valid at certain phase steps (i.e. a stable value is obtained from the data signal and it matches the expected value), while the samples obtained from the data signal at other phase steps will not be valid (i.e. the signal value obtained at the given phase step does not always match the expected value). Where the integrated circuit device being tested is "good", it will be expected that a valid sample of the particular data signal received from a corresponding integrated circuit device may be taken over a finite number of consecutive phase steps of the second sampling clock. Using this information, a test engineer or test program, for example, will be able to identify a corresponding length of time in which a valid sample can be expected to be taken from the particular data signal originating from the integrated circuit device. As previously noted, this length of time may be defined conceptually as a "data valid window".

In the example of FIG. 7, data valid windows 112, 114, 116 and 118 may be identified for each of four integrated circuit devices of one example of an integrated circuit module being tested. Each data valid window for each integrated circuit device may be expected to meet specification requirements for that type of integrated circuit device in order to pass the testing procedure. It may be observed that in respect of any one particular data signal originating from a particular integrated circuit device, the associated data valid window (e.g. one of 112, 114, 116, 118) identified after executing a number of acts in an embodiment of a testing method described herein may be determined to meet specification requirements (e.g. the data valid window is sufficiently wide). In performing the testing method, the data valid windows are identified not based on the data strobe signals that might be transmitted from the various integrated circuit devices of the integrated circuit module, but rather from determining whether a valid sample may be obtained from the data signals transmitted from the various integrated circuit devices at each of the different phase steps of the second clock signal, as noted above.

In at least one embodiment, the number of phase steps to be defined will be equal to one period of the second clock signal (i.e. the "sampling clock" used by the tester). However, in a variant embodiment, the number of phase steps may be defined so that the phase steps cover a period in time that exceeds one period of the second clock signal. This may be done to ensure that whole data valid windows that might otherwise be truncated at the beginning or end of a given period of the second clock signal are identified. For example, the number of phase steps may be defined so that the phase steps cover a period in time that is at least two times the period of the second clock signal.

Although the data strobe signal generated by each of the integrated circuit devices of the integrated circuit module under test is not actually used by the tester to sample data signals received from the respective integrated circuit device, it may be expected that an edge (e.g. a rising edge) of the data strobe signal (DQS) would be substantially aligned with the center of the corresponding data valid window during the capturing of data by a chipset (possibly after application of an appropriate delay, as shown in FIG. 6B) that might be identified for the respective integrated circuit device, depending on the type of the integrated circuit device. For example, certain memory devices are designed to provide a data strobe signal with outgoing data signals, where in operation, after application of an appropriate delay, the edge of the data strobe signal is to be aligned with the center of a window of data signals to be received by a data recipient. Accordingly, the edge of the data strobe signal provided by an integrated circuit device might be expected to substantially coincide with the corresponding data valid window identified by the tester for that integrated circuit device, as shown at 120 of FIG. 7. In variant embodiments, the tester may also be configured to perform additional tests that utilize the data strobe signal (DQS) received. For example, the tester may be configured to check that the alignment of data strobe signals with respect to the first clock signal meets a certain pre-defined specification requirement.

It may be observed that in the example of FIG. 7, data valid windows 112, 114, 116, and 118 associated with each integrated circuit device of the integrated circuit module under test do not overlap. Known testers may reject this integrated circuit module under test because a common sampling window (e.g. 40 of FIG. 3) cannot be defined in this example. However, it may be the case that the individual data valid windows meet specification requirements, and that the integrated circuit devices of the integrated circuit module pass all of the other tests employed by the tester. The present inventors realized that in respect of integrated circuit modules comprising multiple integrated circuit devices, where each of the integrated circuit devices are designed to provide and/or receive a data strobe signal that facilitates a source-synchronous capturing of data signals, the individual integrated circuit devices of an integrated circuit module may be considered to operate independently of each other. It is not necessary to identify a common sampling window or verify that such a common sampling window meets specification requirements. The rejection of these specific types of integrated circuit modules on the sole basis that a common sampling window that meets specification requirements cannot be identified may be eliminated.

In one embodiment, a test vector waveform corresponding to the generated test vector pattern, including the data signals and corresponding data strobe signals, is transmitted to all of the integrated circuit devices of an integrated circuit module in parallel. Accordingly, response signals from the integrated circuit devices will also be received substantially in parallel. Testing multiple integrated circuit devices in parallel in this manner may allow the various data valid windows associated with the integrated circuit devices of the integrated circuit module to be identified more efficiently. However, each integrated circuit device of an integrated circuit module may be tested sequentially, or in some other combination (e.g. sets of integrated circuit devices tested sequentially, but with integrated circuit devices in the same set being tested in parallel) in variant embodiments.

Figure 8:
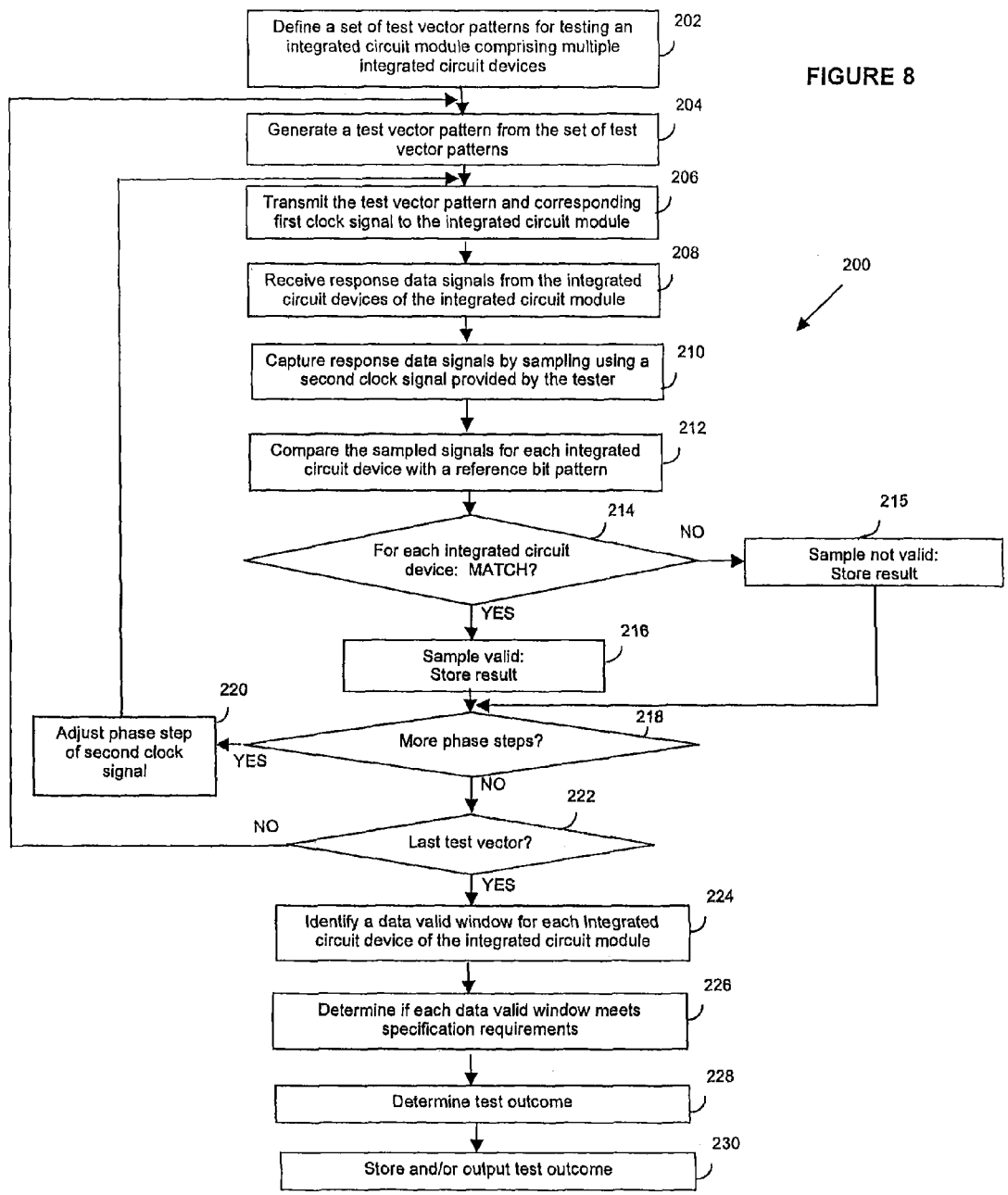
FIG. 8 is a flowchart illustrating a method of testing an integrated circuit module comprising a plurality of integrated circuit devices in accordance with at least one example embodiment.

Reference is now made to FIG. 8, in which a flowchart illustrating a method for testing an integrated circuit module comprising a plurality of integrated circuit devices in accordance with at least one embodiment is shown generally as 200. Some of the features of the embodiments described herein may have been previously described in the present description (e.g. with reference to FIG. 7).

In addition to data signals, each of the plurality of integrated circuit devices utilizes a corresponding signal that facilitates a source-synchronous capturing of data. The corresponding signal is referred to herein as a data strobe signal. In accordance with at least one embodiment, the integrated circuit module is a memory module comprising a plurality of memory devices that utilize data strobe signals (e.g. DDR SDRAM, DDR2 SDRAM, DDR3 SDRAM, or some combination thereof). In variant embodiments, the integrated circuit module comprises a plurality of ASICs that utilize data strobe signals.

In example embodiments described herein, the acts of method 200 are performed by a tester module. However, in variant embodiments, some of these acts may be proxied to a different module coupled to the tester module.

At 202, a finite set of test vector patterns for testing the integrated circuit devices of the integrated circuit module is defined.

In one embodiment, where the communication channel (e.g. communication channel 6 of FIG. 1) between the integrated circuit module and the tester has a limited passband associated with it, then the test vector patterns may be defined to account for the passband constraints. For example, the test vector patterns may be defined and generated in accordance with a method of generating test vector patterns as described in co-pending U.S. patent application Ser. No. 11/779,629. The contents of U.S. patent application Ser. No. 11/779,629 are hereby incorporated by reference.

At 204, a test vector pattern is generated from the set of test vector patterns defined at 202. In at least one embodiment, the test vector pattern is generated by a tester module (e.g. tester 10 of FIG. 1). For example, where the test vector pattern is generated by tester 10 of FIG. 1 as described earlier in this description, an instruction is fetched from program memory 12 by a microprocessor 16. In response to that instruction, microprocessor 16 instructs TVPG 18 to generate a digital representation of a test vector pattern, which TVPG 18 then sends to controller 14. Controller 14 converts the test vector pattern into an electrical signal (a "test vector waveform") for transmission to DUT 20, namely the integrated circuit module being tested.

At 206, a data signal comprising a test vector waveform corresponding to the test vector pattern generated at 204 is transmitted to the integrated circuit module across the communication channel (e.g. by tester 10). A first clock signal having a first frequency and a first phase is also transmitted to the integrated circuit module along with the test vector waveform at 206. The test vector waveform also contains appropriate data signals with corresponding data strobe signals. The first clock signal is aligned with the test vector waveform such that an integrated circuit device that receives the test vector waveform may use the first clock signal to time when the test vector waveform should be sampled. In other words, the capturing of the data embodied in the test vector waveform received by any given integrated circuit device of the integrated circuit module under test is synchronized with the accompanying first clock signal, where the capturing of data may be performed with the assistance of the accompanying data strobe signals. The first phase and the first frequency of the first clock signal may be set by a microprocessor (e.g. microprocessor 16 of FIG. 1). The first clock signal may be generated by a test vector pattern generator (e.g. TVPG 18 of FIG. 1) and output by a controller of the tester (e.g. controller 14 of FIG. 1) to the integrated circuit module.

In operation, the test vector patterns transmitted to the integrated circuit module are used to test at least one integrated circuit device of the integrated circuit module. For example, where the integrated circuit module comprises a memory device, the test vector pattern (after being converted back into digital form at the memory device) can be written to the memory device. A controller (e.g. controller 14 of FIG. 1) of the tester would then retrieve stored digital data across the communication channel via a "read" operation. Upon comparison (e.g. by a comparator associated with that memory device, such as comparator 19 or comparator 21 of FIG. 1) with the expected bit pattern, a micro-processor (e.g. microprocessor 16 of FIG. 1) can digitally determine if the memory device being tested is performing correctly to specification in respect of that test vector pattern. It will be understood that the same test vector pattern may be transmitted to all integrated circuit devices of the integrated circuit module (e.g. in parallel), or different test vector patterns may be transmitted to different integrated circuit devices of the integrated circuit module. An integrated circuit module may also comprise different types of integrated circuit devices.

At 208, response data signals comprising bit pattern waveforms transmitted by the integrated circuit module under test are received across the communication channel (e.g. in response to a "read" operation). The bit pattern waveforms are received as electrical signals at the tester, and correspond to digital signals produced by each integrated circuit device of the integrated circuit module under test, in response to the test vector pattern that was transmitted at 206.

In accordance with embodiments described herein, the tester is configured to generate its own second clock signal having a second frequency for use it as a sampling clock signal. In at least one embodiment, the second clock signal will have a second frequency that is the same as the first frequency of the first clock signal to which the transmitted test vector waveforms are synchronized.

The second clock signal is used by the tester to sample the data signals received by the tester at 208. In a given test cycle, an iteration comprising the acts described at 204 through to 216 inclusive (some acts are described in further detail below) will be repeated multiple times. In each iteration, the phase of the second clock signal will be adjusted (e.g. incremented or decremented) by one of a number of pre-defined phase steps. For example, if a period of the second clock signal is 2 ns, then each phase step may be 10 ps. In one embodiment, for the first iteration of a test cycle, the initial phase of the second clock signal may be defined such that the second clock signal is initially edge-aligned with a first clock signal having the same frequency. In variant embodiments, the initial phase of a second clock signal may be defined such that the second clock signal is not initially edge-aligned with the first clock signal (e.g. an edge of the second clock signal may initially be aligned with a center of a first window of the first clock signal, i.e. 90 degrees out of phase).

Accordingly, in at least one embodiment, unlike the first clock signal that will generally be fixed in phase for a particular test cycle, the second clock signal will generally have an adjustable phase over the same test cycle in method 200.

At 210, the response data signals received at 208 are captured by the tester, wherein the response signals are converted into digital form, using the second clock signal having one of a plurality of pre-defined phase steps. As described above, the second clock signal is used by the tester to time the sampling of the response data signals received from the integrated circuit devices of the integrated circuit module under test.

At 212, the sampled bit patterns resulting from the sampling of the response data signals at 210 are compared with a reference (i.e. expected) bit pattern. For example, if the integrated circuit module being tested is a memory module, the reference bit pattern may be the digital representation of the bit pattern of the test vector pattern waveform generated at 204. In one example embodiment, a controller (e.g. 14 of FIG. 1) of the tester module sends the sampled incoming waveforms as bit patterns to a plurality of comparators (e.g. 19, 21 of FIG. 1), which compares the incoming bit patterns to the previously stored reference bit patterns transmitted thereto by a reference memory module (e.g. 15 of FIG. 1).

In at least one embodiment, separate sets of comparisons for each integrated circuit device of the integrated circuit module under test are performed. For example, although the response data signal originating from a particular integrated circuit device may comprise multiple data bits, a determination that all of the data bits match the corresponding reference bits will be made for that integrated circuit device. In such embodiments, for a particular integrated circuit device, a digital mismatch will be produced if at least one of the data bits of the response data signal originating from that integrated circuit device does not match the expected bit value.

Accordingly, for each integrated circuit device of the integrated circuit module under test, decision 214 is performed, with possible outcomes 215 and 216 as shown in FIG. 8. For each integrated circuit device, if at least one of the comparisons performed for that integrated circuit device at 212 produces a digital mismatch, then decision 214 results in a determination that the sample of the response data signal received from that integrated circuit device is not valid, as shown at 215. In at least one embodiment, this information (that the sample was determined not to be valid for the particular integrated circuit device at a particular phase step of the second clock signal) is stored by the tester for later use (e.g. by microprocessor 16 of FIG. 1 in a memory store) until all phase adjustments are performed for that particular test vector pattern. On the other hand, if the comparisons performed for that integrated circuit device at 212 do not produce a digital mismatch, then decision 214 results in a determination that the sample of the response data signal received from that integrated circuit device is valid, as shown at 216. In at least one embodiment, this information (that the sample was determined to be valid for the particular integrated circuit device at a particular phase step of the second clock signal) is stored by the tester for later use, as noted above. In particular, this information may be used to identify a data valid window for the particular integrated circuit device at 224, as described below.

At 218, it is determined whether there are any remaining phase steps in the current test cycle for which the second clock signal is to be adjusted in further iterations of the test cycle. If there are more phase steps, then the phase of the second clock signal is adjusted (e.g. incremented or decremented) by a phase step at 220 and the flow of method 200 returns to 206 where the test vector pattern previously generated at 204 is re-transmitted to the integrated circuit module. Otherwise, the flow method 200 proceeds to 222. It will be understood that although reference is made herein to a "series" of phase steps under which testing is performed for a given test cycle, the term "series" does not imply that the phase steps are ordered, although the phase steps may be ordered in example embodiments.

At 222, it is determined whether there are more test vector patterns to be transmitted to test the integrated circuit devices of the integrated circuit module under test. If so, then decision 222 may result in the flow of method 200 returning to repeat acts of method 200 beginning at 204, in order to generate another test vector pattern from the set of test vector patterns defined at 202. The second clock signal may be reset to the initial phase before repeating these acts. If there are no more test vector patterns to be transmitted to the integrated circuit module under test, then the flow of method 200 continues to 224.

At 224, a data valid window is identified for each integrated circuit device of the integrated circuit module under test. As the phase of the second sampling clock is changed (at 220), it will be expected that the samples subsequently obtained from a particular data signal (at 210) will be valid at certain phase steps (i.e. a stable value is obtained from the data signal and it matches the expected value), while the samples obtained from the data signal at other phase steps will not be valid (i.e. the signal value obtained at the given phase step does not always match the expected value). When a particular sample taken is determined to be valid (at 214), this information may be recorded by the tester (at 216). If the integrated circuit device being tested is "good", then it will be expected that a valid sample of the particular data signal received from a corresponding integrated circuit device in response to the transmission of a particular test vector pattern transmitted to that integrated circuit device may be taken over a finite number of consecutive phase steps of the second sampling clock, where the phase steps are sufficiently small (e.g. each phase step is a fraction of the clock period). Using the information recorded by the tester (e.g. at 215 and/or 216), a test engineer or test program, for example, will be able to identify a corresponding length of time in which a valid sample can be expected to be taken from the particular data signal originating from the integrated circuit device, defined herein as a data valid window for that particular integrated circuit device. The samples taken at the various phase steps are expected to also be valid for signals received in response to all of the other test vector patterns in the defined set of patterns transmitted to the given integrated circuit device in computing the data valid window. In one example, data valid windows identified for an integrated circuit module that comprises four integrated circuit devices is shown in FIG. 7, as previously described.

At 226, for each integrated circuit device of the integrated circuit module under test, a determination is made as to whether the corresponding data valid window identified at 224 meets the specification requirements of the integrated circuit device as part of the integrated circuit module.

At 228, a test outcome is determined. The test outcome may be recorded, output by the tester, or both, for example, at 230. The test outcome determined at 228 may indicate whether or not one or more data valid windows identified at 224 failed to meet specification requirements as determined at 226. In at least one embodiment, where at least one data valid window is determined as failing to meet specification requirements, the integrated circuit module as a whole may be deemed to be defective and the test outcome may reflect this failure state accordingly. It will be understood by persons skilled in the art that the test outcome determined at 228 may also provide information on other tests that may have been performed in the test cycle. The details of other tests that may have been performed are not explicitly described herein, for ease of exposition.

As the integrated circuit module under test comprises multiple integrated circuit devices, each of which is designed to provide and/or receive a data strobe signal that facilitates a source-synchronous capturing of data in normal operation, the integrated circuit devices of the integrated circuit module may be deemed to operate independently of one another. There is no need to identify a common sampling window or to verify that the common sampling window meets specification requirements. Accordingly, the determination of the test outcome at 228 is performed after the data valid windows are identified at 224 without identifying a common sampling window defined by an intersection of the identified data valid windows, and without verifying that such common sampling window meets specification requirements.

In contrast, conventional test methodologies may require that a common sampling window be identified and that the common sampling window be verified as meeting specification requirements. The inventors realized that the provision and/or utilization of data strobe signals by certain integrated circuit devices might allow for a softening of certain requirements imposed by conventional test methodologies, even though the data strobe signals themselves may not be employed by a tester in embodiments described herein during an actual testing procedure. For example, the present inventors realized that the use of these conventional test methodologies for testing integrated circuit modules that comprise integrated circuit devices that provide and/or receive data strobe signals might result in an unnecessary increase in the number of integrated circuit modules that are rejected merely because the common sampling window itself does not meet specification requirements. At least some of the embodiments as described herein address some of the disadvantages of known testers that employ such conventional test methodologies.

It will be understood by persons skilled in the art that in variant embodiments, at least some of the acts of method 200 may be repeated in additional test cycles to provide for more comprehensive testing.

For example, the acts described at 204 through 222 may be repeated after adjusting the number of the phase steps of the second clock signal, the size of the phase steps of the second clock signal or both. This allows the integrated circuit module to be tested under a variety of different sets of phase steps for the same clock frequency. Data valid windows may be identified at 224 after testing is completed at different clock frequencies, or alternatively, separate data valid windows may be identified for each clock frequency.

As a further example, features of the above variants may be implemented in combination, where the integrated circuit module is tested under a variety of different sets of phase steps in accordance with multiple clock frequencies.

As a further example, the acts described at 204 through 222 may be repeated after adjusting the first frequency of the first clock signal to a different frequency, the first phase of the first clock signal to a different phase, or both the first frequency and first phase of the first clock signal to a different frequency and phase respectively in a subsequent test cycle. Moreover, features of any of these variants relating to frequency adjustments, phase adjustments, or both of the first clock signal may be implemented in combination with one or more features of the variants described above relating to frequency adjustments, phase adjustments, or both of the second clock signal.

Generally, the initial set of test vectors at 202 is defined only one, even if other acts described at 204 through 222 are to be repeated. However, in variant embodiments, the set of test vectors may be redefined by repeating the act described at 202.

In variant embodiments, the testing may also be terminated prematurely even if all of the test vector patterns have not yet been transmitted and/or if the second clock has not yet been adjusted to test the integrated circuit devices of the integrated circuit module under all of the phase steps of the second clock signal (e.g. a manual instruction to terminate the test is received at the tester, or if it has already been determined that the integrated circuit module is defective).

Although the embodiments described herein illustrate acts in the testing of a single integrated circuit module comprising multiple integrated circuit devices, these acts may also be performed to test multiple integrated circuit modules in parallel, each comprising multiple integrated circuit devices, in variant embodiments.

As used herein, the phrase "and/or" is intended to represent an inclusive-or. That is, "X and/or Y" is intended to mean X or Y or both. Moreover, "X, Y, and/or Z" is intended to mean X or Y or Z or any combination thereof.

The embodiments described herein have been shown and described by way of a number of examples. It will be apparent to those skilled in the art that changes and modifications to the described embodiments may be made without departing from the substance and scope of the described embodiments, as defined in the appended claims.

The invention claimed is:

1. A method of testing an integrated circuit module, the integrated circuit module comprising a plurality of integrated circuit devices, the method comprising:
   generating a plurality of test vector patterns;
   generating a first clock signal having a first frequency and a first phase;
   generating a plurality of second clock signals, each of the plurality of second clock signals having the first frequency and one of a plurality of second phases;
   for each of the plurality of test vector patterns and for each of the plurality of second clock signals:
      transmitting the respective test vector pattern and the first clock signal to at least one of the plurality of integrated circuit devices via a communication channel,
      receiving at least one data signal from the at least one of the plurality of integrated circuit devices via the communication channel in response to the transmitting,
      capturing the at least one data signal received from the at least one of the plurality of integrated circuit devices in digital form by sampling the at least one data signal using the respective second clock signal of the plurality of second clock signals,
      comparing the at least one data signal when captured in digital form with a reference pattern associated with the respective test vector pattern, and
      determining one or more results from the comparing, wherein the one or more results are associated with both the respective test vector pattern and the respective second clock signal having one of the plurality of second phases;
   identifying a data valid window for each of the plurality of integrated circuit devices from at least one of said results determined for the plurality of test vector patterns and the plurality of second clock signals, wherein the data valid window defines a length of time in which a valid sample can be expected to be taken from data signals transmitted by the respective integrated circuit device;
   verifying that the data valid window for each of the plurality of integrated circuit devices meets specification requirements;
   determining at least one test outcome for the integrated circuit module, wherein the at least one test outcome is based on at least one result of the verifying; and
   at least one of recording and outputting the at least one test outcome for the integrated circuit module;
   wherein each of the plurality of integrated circuit devices, when in operation, utilizes a data strobe signal that accompanies at least one of data signals being transmitted from and data signals received by the respective integrated circuit device; and
   wherein the determining at least one test outcome is performed after identifying the data valid window for each integrated circuit device of the integrated circuit module without having both computed a common sampling window and verified that the common sampling window meets specification requirements.

2. The method of claim 1, wherein the transmitting comprises transmitting the respective test vector pattern and the first clock signal to each of the at least one of the plurality of integrated circuit devices in parallel.

3. The method of claim 1, further comprising:
   changing the first frequency of the first clock signal;
   repeating the generating a plurality of second clock signals; and
   repeating the transmitting, receiving, capturing, sampling, comparing and determining one or more results for each of the plurality of test vector patterns and for each of the plurality of second clock signals.

4. The method of claim 1, wherein the plurality of second phases are defined as a series of phase steps.

5. The method of claim 4, further comprising:
   changing the plurality of second phases by modifying the series of phase steps;
   repeating the generating a plurality of second clock signals having a changed plurality of second phases; and
   repeating the transmitting, receiving, capturing, sampling, comparing and determining one or more results for each of the plurality of test vector patterns and for each of the plurality of second clock signals.

6. The method of claim 5, wherein the series of phase steps is modified by modifying at least one of the number of phase steps and the size of phase steps.

7. The method of claim 1, wherein the integrated circuit module is a memory module comprising a plurality of memory devices.

8. The method of claim 7, wherein the memory module comprises DDR SDRAM memory devices.

9. The method of claim 7, wherein the memory module comprises DDR2 SDRAM memory devices.

10. The method of claim 7, wherein the memory module comprises DDR3 SDRAM memory devices.

11. The method of claim 1, wherein the integrated circuit module comprises a plurality of application specific integrated circuits.

12. A testing system for testing at least one integrated circuit module, each of the at least one integrated circuit module comprising a plurality of integrated circuit devices, the system comprising:
   a processor;
   a program memory;
   and a controller;
   wherein the system is configured, for each of the at least one integrated circuit module, to:
   generate a plurality of test vector patterns;
   generate a first clock signal having a first frequency and a first phase;

generate a plurality of second clock signals, each of the plurality of second clock signals having the first frequency and one of a plurality of second phases;

for each of the plurality of test vector patterns and for each of the plurality of second clock signals:

transmit the respective test vector pattern and the first clock signal to at least one of the plurality of integrated circuit devices of the respective integrated circuit module via a communication channel, receive at least one data signal from the at least one of the plurality of integrated circuit devices of the respective integrated circuit module via the communication channel in response to transmitting the respective test vector pattern and the first clock signal, capture the at least one data signal received from the at least one of the plurality of integrated circuit devices of the respective integrated circuit module in digital form by sampling the at least one data signal using the respective second clock signal of the plurality of second clock signals, compare the at least one data signal when captured in digital form with a reference pattern associated with the respective test vector pattern, and determine one or more results from comparing the at least one data signal when captured in digital form with a reference pattern associated with the respective test vector pattern, wherein the one or more results are associated with both the respective test vector pattern and the respective second clock signal having one of the plurality of second phases;

identify a data valid window for each of the plurality of integrated circuit devices of the respective integrated circuit module from at least one of said results determined for the plurality of test vector patterns and the plurality of second clock signals, wherein the data valid window defines a length of time in which a valid sample can be expected to be taken from data signals transmitted by the respective integrated circuit device;

verify that the data valid window for each of the plurality of integrated circuit devices of the respective integrated circuit module meets specification requirements;

determine at least one test outcome for the respective integrated circuit module, wherein the at least one test outcome is based on at least one result of verifying that the data valid window for each of the plurality of integrated circuit devices of the respective integrated circuit module meets specification requirements; and at least one of record and output the at least one test outcome for the integrated circuit module;

wherein each of the plurality of integrated circuit devices of the respective integrated circuit module, when in operation, utilizes a data strobe signal that accompanies at least one of data signals being transmitted from and data signals received by the respective integrated circuit device; and wherein the system is configured to determine the at least one test outcome after identifying the data valid window for each integrated circuit device of the respective integrated circuit module without having both computed a common sampling window and verified that the common sampling window meets specification requirements.

13. The system of claim 12, further comprising: a test vector pattern generator for generating the plurality of test vector patterns and generating the first clock signal; and a comparator for comparing the at least one data signal when captured in digital form with a reference pattern associated with the respective test vector pattern.

14. The system of claim 12, further comprising a reference memory module.

15. The system of claim 12, further comprising a reference logic module.

16. The system of claim 12, wherein the system is configured to transmit the respective test vector pattern and the first clock signal to each of the at least one of the plurality of integrated circuit devices of at least one integrated circuit module in parallel.

17. The system of claim 12, wherein the system is configured to transmit the respective test vector pattern and the first clock signal to each of the at least one of the plurality of integrated circuit devices of every one of the at least one integrated circuit module in parallel.

* * * * *